(12) United States Patent
Lichtenberger

(10) Patent No.: US 6,390,353 B1
(45) Date of Patent: May 21, 2002

(54) INTEGRAL SOLDER AND PLATED SEALING COVER AND METHOD OF MAKING THE SAME

(75) Inventor: Heiner Lichtenberger, Williamsville, NY (US)

(73) Assignee: Williams Advanced Materials, Inc., Buffalo, NY (US)

( * ) Notice: Subject to any disclaimer, the term of this patent is extended or adjusted under 35 U.S.C. 154(b) by 0 days.

(21) Appl. No.: 09/226,339

(22) Filed: Jan. 6, 1999

Related U.S. Application Data

(60) Provisional application No. 60/070,565, filed on Jan. 6, 1998.

(51) Int. Cl.⁷ .......................... B21D 39/00; B23K 35/12
(52) U.S. Cl. ...................................... 228/173.1; 228/254
(58) Field of Search .................. 228/254, 235.2, 228/170, 208, 124.6, 209, 214, 141.1, 164, 173.1, 173.6; 174/52.5; 29/527.1, 588; 428/672

(56) References Cited

U.S. PATENT DOCUMENTS

| | | | |
|---|---|---|---|
| 3,823,468 A | 7/1974 | Hascoe | |
| 3,874,549 A | 4/1975 | Hascoe | |
| 3,909,209 A | * 9/1975 | Kruper et al. | 29/183.5 |
| 4,020,987 A | 5/1977 | Hascoe | |
| 4,328,921 A | * 5/1982 | Liang | 228/222 |
| 4,331,253 A | 5/1982 | Gordon et al. | |
| 4,331,258 A | 5/1982 | Geschwind | |
| 4,372,037 A | 2/1983 | Scapple et al. | |
| 4,601,958 A | 7/1986 | Levine | |
| 4,640,436 A | 2/1987 | Miyoshi et al. | |
| 4,640,438 A | 2/1987 | Trevison et al. | |
| 4,666,796 A | 5/1987 | Levine | |
| 4,727,633 A | * 3/1988 | Herrick | 228/122 |
| 4,737,418 A | * 4/1988 | Slattery | 428/672 |
| 4,750,665 A | 6/1988 | Falanga | |
| 4,835,067 A | 5/1989 | Levine | |
| 4,842,961 A | 6/1989 | Basile et al. | |
| 4,854,495 A | 8/1989 | Yamamoto et al. | |
| 5,639,014 A | * 6/1997 | Damiano et al. | 228/254 |
| 5,881,945 A | * 3/1999 | Edwards et al. | 228/124.6 |
| 6,022,426 A | * 2/2000 | Mennucci et al. | 148/527 |

* cited by examiner

Primary Examiner—Tom Dunn
Assistant Examiner—Zidia Pittman
(74) Attorney, Agent, or Firm—Jaeckle Fleischmann & Mugel, LLP

(57) ABSTRACT

A method of making an integral plated and solder clad cover lid for electronic packages is disclosed. The cover lid is plated and or clad with a first corrosion resistant and solderable material and is clad with a solder material on one side. The cladded substrate is stamped and then plated with a second corrosion resistant and solderable material. The second material is subsequently sintered and preferentially diffused into the solder material resulting in a visual distinction between the solder side of the cover lid and the backing side.

30 Claims, 4 Drawing Sheets

INTEGRAL SOLDER AND PLATED SEALING COVER AND METHOD OF MAKING THE SAME

This is a conversion of U.S. Provisional Application No. 60/070,565, filed Jan. 6, 1998.

FIELD OF INVENTION

The present invention relates to a clad lid for electronic packages, in particular, to a clad lid with an identifiable clad lid.

BACKGROUND OF THE INVENTION

Electronic packages are routinely sealed with covers. In U.S. Pat. No. 5,639,014 (Damiano et al.), Damiano et al. disclose a cover in its background of the invention. That cover comprises a substrate material, having a compatible coefficient of thermal expansion such as Alloy 42 or Kovar, plated with nickel as a corrosion barrier and gold as a solderable material. A gold and 20% tin eutectic solder is cladded to the gold plated layer of that cover. In most instances the solder is applied to just one side of the cover for economic reasons. A second gold plated layer is plated on the solder layer and the backing side (already a gold layer if solder is on one side).

Damiano et al. use a process to fabricate that cover that is disclosed in U.S. Pat. No. 4,737,418 (Slattery). The Slattery process comprises the steps of plating various layers of metal or alloys on a substrate and cladding a layer of metal or alloy on the top plated layer. The cladded substrate is then stamped to the desired cover size. Once the cover is stamped to the desired size, the cover is plated with a corrosion resistant metal, i.e., gold, to cover at least the ends of the cover and one side of the cover.

There are problems with the cover of Damiano et al. One problem is that a manufacturer must be able to distinguish the backing side from the solder side to properly orientate the cover on the electronic package. Damiano et al. recognize that it is extremely difficult to differentiate the two sides of its cover since both sides are colored gold. Damiano et al. propose two options to solve this problem. The first option is to form a solder window on the solder side and the other option is to apply solder to both sides. The latter option is extremely costly and inefficient. The solder window of the first option creates further problems.

There are two processes to fabricate the solder window. One process preforms the solder window and applies the preformed window onto the plated substrate. That process has numerous alignment problems that make it difficult to perform. The other process applies a mask material for the window and then applies the solder. The mask material can either be removed or not. In either process the second plated gold layer is applied to the solder layer and the sides. The resulting cover has a ridged solder side (if the mask material is removed or the preform process is used) and a smooth backing side.

The problems with the solder window are that (1) a proper seal between the cover and the electronic package may not occur and (2) the solder will not provide a solder junction that is visibly detectable. The first problem occurs when distinguishing the solder side from the backing side. The solder side is distinguishable from the backing side by feeling the ridge on the solder side. Feeling for the ridge can remove some of the solder and thereby destroy the desired seal between the electronic package and the cover.

The second problem occurs because a visible seal between the cover and the electronic package may not occur with a solder window. The thickness of the solder for clad lids is typically one third to half of that used in normal frame and lid assemblies. During the sealing of the lid, some of the molten solder from the interior of the lid is drawn to the sealing edge by capillary action. The sealing edge forms a solder junction considerably thicker than the original clad layer and provides a visual indication that the lid is sealed to the electronic package. If visual inspection is desired, then a solder junction by a solder window (with or without the mask layer) may not be acceptable.

The present invention solves the above-identified problems. The present invention alters the color of the solder side so that the backing side and the solder side are visually distinct from each other. Moreover, the solder side provides a solder junction that can be visually inspected.

SUMMARY OF THE INVENTION

A method of making an integral plated and solder clad cover lid for electronic packages is disclosed. The cover lid is plated and or clad with a first corrosion resistant and solderable material and is clad with a solder material on one side. The cladded substrate is stamped and then plated with a second corrosion resistant and solderable material. The second material is subsequently sintered and preferentially diffused into the solder material resulting in a visual distinction between the solder side of the cover lid and the backing side.

DETAILED DESCRIPTION OF THE PRESENT INVENTION

Figure 1:
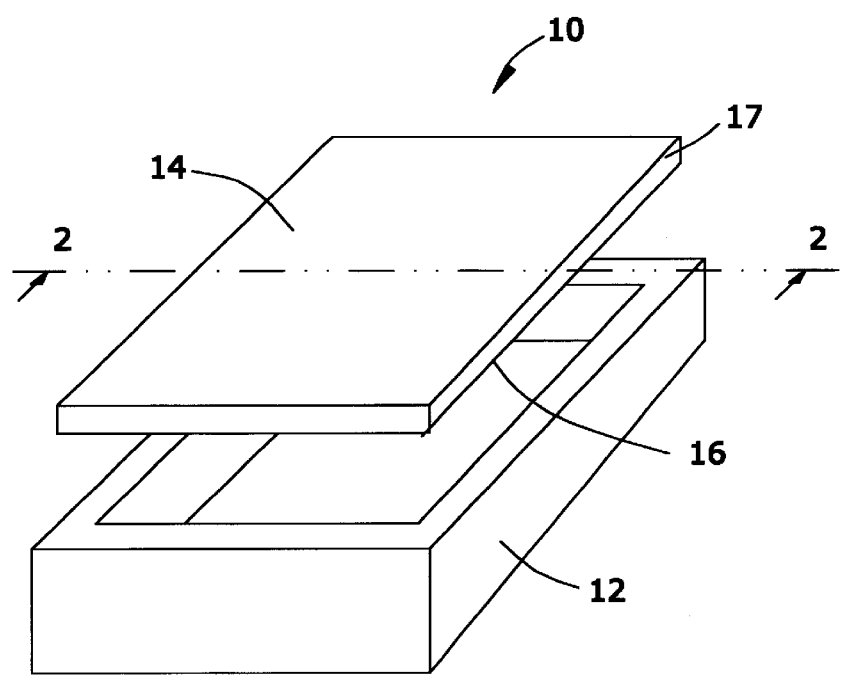
FIG. 1 is a cover lid being orientated over an electronic package.

FIG. 1 shows a cover lid 10 being orientated over an electronic package 12. As shown, the cover lid 10 is properly orientated over the package 12 with a backing side 14 facing away from the electronic package 12 and a solder side 16 facing the package 12. The lid 10 also comprises edges 17.

Figure 2:
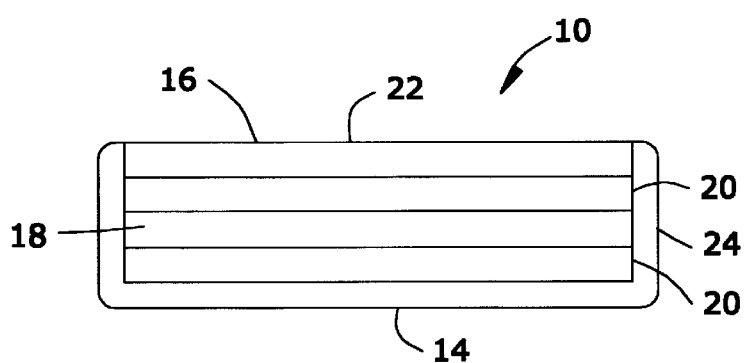
FIG. 2 is a cross-sectional view of the cover lid of FIG. 1 taken along the lines 2—2.

FIG. 2 shows a cross-sectional view of cover lid 10 from FIG. 1 along the lines 2—2. The cover lid 10 comprises a controlled expansion substrate 18, at least one corrosion resistant and solderable material layer 20 over at least one side of the substrate, a solder layer 22 over at least one side of the corrosion resistant layer 20, a thin layer 24 over the solder layer 22 and at least the edges 17.

Figure 3A:
FIGS. 3a–3f illustrate the process to fabricate the cover lid of FIG. 2.

FIGS. 3a–3f illustrate the process to fabricate the cover lid 10 shown in FIG. 2. FIG. 3a shows the controlled expansion substrate 18. The substrate 18 is a continuous thermal expansion controlled alloy. Such alloys include and are not limited to Alloy 42 and Kovar. The substrate 18 can be a continuous strip or sheet.

Figure 3B:
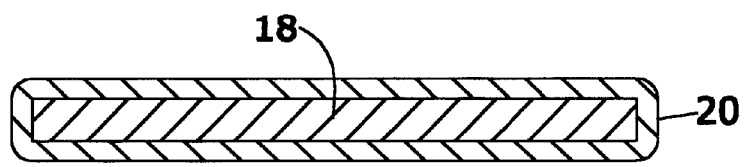

FIG. 3b shows the step of applying the corrosion resistant material and solderable material 20 on the substrate 18. The corrosion resistant material 20 is any metal or alloy such as nickel, palladium, silver, tin, gold and alloys thereof. Preferably, the material 20 is nickel. The corrosion resistant material 20 can be applied by conventional plating processes, melting, or cladding onto the substrate 20. The thickness of the layer 20 is dependent upon the desired requirements for corrosion protection.

Figure 3C:
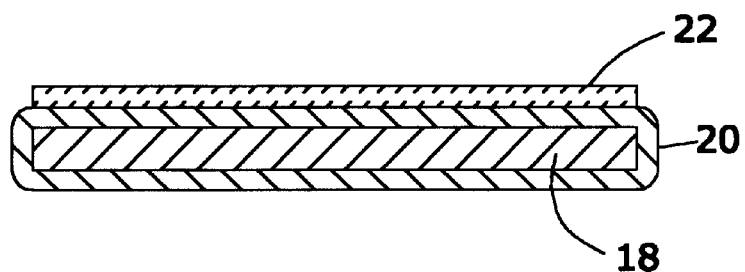
Figure 3D:
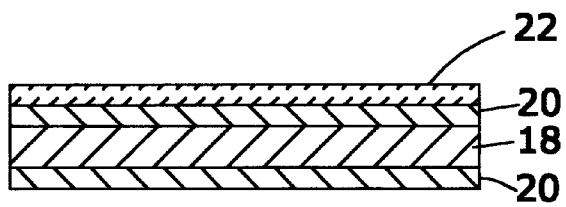

FIG. 3c shows the step of applying the solder layer 22 over the corrosion resistant material 20. The solder can be comprised of 80% gold 20% tin or 78% gold 22% tin or similar chemistry of gold tin with gold varying from 75% to 83%. The solder can also be comprised of lead, tin, or indium, with or without additions of other metals which are used to vary the melting temperature and flow characteristics. All of these solders have a white color which is visually distinguishable from the white colors of nickel, silver or palladium and of course the gold color of gold. These solders can be clad or melted onto the lid 10. When the solder is melted onto the lid 10 a suitable flux is used and the surface is then skived or machined to produce a uniform solder thickness.

Figure 3E:
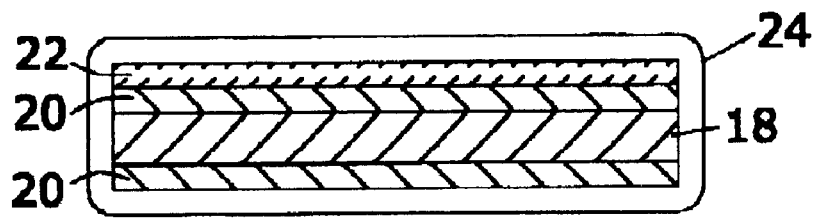

The composite substrate, as shown in FIG. 3e, is stamped using conventional technology. After stamping the parts are completely coated with a thin layer 24, approximately ¼ microns, of a precious metal or alloys thereof as shown in FIG. 3g. The precious metal can any kind, preferably gold for the gold/tin solders, and gold or silver for the corrosion resistant material 20 solders. After electroplating the solder side 16 and the backing side 14 are indistinguishable. Moreover, it is very difficult to mark or mask one side prior to or during stamping.

Figure 3F:
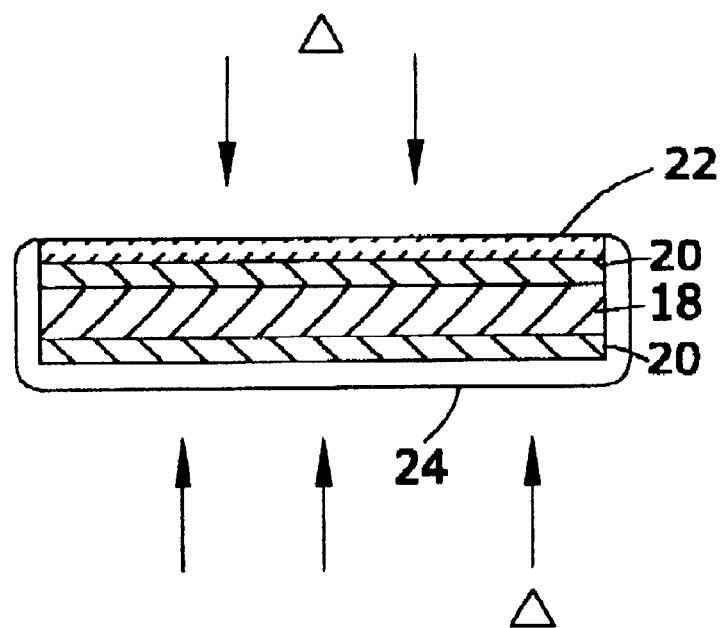

After plating, heat is applied to the thin layer 24 as shown in FIG. 3f. The heat is applied at a sufficient temperature and time to cause the diffusion of the plating layer 24 on the solder layer 22 into the solder layer 22. Thereby, restoring the solder layer 22 to its original color. The diffusion rate of the thin layer 24 into the low melting temperature solder 22 is much faster than it is into the other layers 18 and 20 including edges 17 and backing side 14.

Figure 4A:
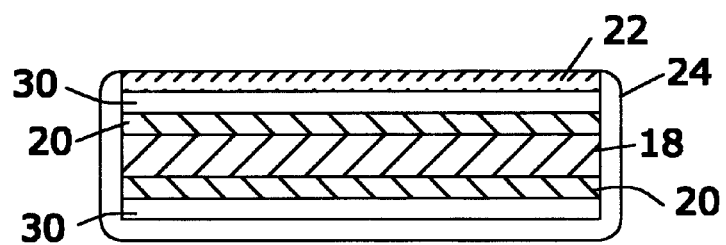
FIGS. 4a–4b illustrate alternative embodiments of FIG. 2.
Figure 4B:
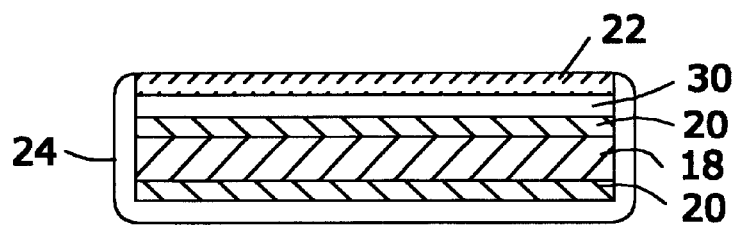

FIGS. 4a and 4b are alternative cross-sectional views of lid 10 of FIG. 2. FIG. 4a shows an additional corrosion resistant and solderable material 30 overlaying the corrosion resistant layer 20. The additional layer 30 can be applied to the resistant layer 20 with the same processes that layer 20 is applied to substrate 18. As shown in FIG. 4b, the additional material 30 can be on just one side of the lid, preferably, the solder side. In either case, the additional layer 30 heightens the solderability and corrosion protection provided by layer 20. Preferably, the additional layer 30 is a precious metal such as gold, palladium or silver. The thickness of the additional layer 30 is not critical and depends on the desired requirement for corrosion protection.

Figure 5:
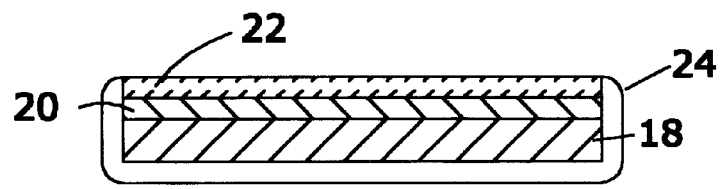
FIG. 5 illustrates an alternative embodiment of FIG. 2.

FIG. 5 shows an alternative embodiment of FIG. 2. This alternative embodiment has the corrosion resistant material 20 on just one side of the substrate 18.

EXAMPLE 1

The Kovar substrate is electroplated with 6 microns of nickel and then plated with 4 microns of pure gold. The 80% gold 20% tin alloy is cleaned and then bonded onto one side of the plated substrate using a cladding mill with heated rolls set at 200° C. A reduction in area of 40% to 60% is taken on the strip materials in this bonding process.

The bonded strip is then rolled to 0.25 mm thick on a rolling mill with heated rolls. The gold/tin alloy is 0.03 mm thick at this stage. The strip is slit to remove rough edges and to fit into the stamping die. Individual lids 3.5 mm square are stamped after the strip is passed over a heated rail set at 275° C. The parts are stamped with the burr on the solder side. This burr orientation and heating of the strip insures that the brittle gold/tin solder will not crack.

The parts are then cleaned and electroplated with ¼ micron of gold. The parts (100,000 max.) are placed into a stainless steel tray and put into a nitrogen containing oven set at 190° C. for 20 minutes, the oven is then turned off and the parts are removed after the oven cools to below 70° C.

EXAMPLE 2

The same general process as example 1 except that the gold/tin alloy is 78% gold and 22% tin and has a final thickness of 0.02 mm.

EXAMPLE 3

The same general process as example 1 except that the substrate is clad with nickel on both sides and 2 microns of gold on one side. This clad process is less costly than the electroplating process. The gold/tin alloy will be bonded onto the gold side of the clad substrate. The nickel side will still remain gold colored after the parts are plated and heat treated because of the difference in diffusion rates of gold into solder and nickel.

EXAMPLE 4

Kovar is plated on both sides with 4 microns of Nickel to a total thickness of 0.22 mm. A 86% lead 8% bismuth, 4% tin, 1% indium and 1% silver solder is continuously melted, using an active acid flux, onto the nickel plated Kovar strip. The solidified solder is approximately 0.05 mm thick and is then skived to a final thickness of 0.03 mm. The skiving operation is required to obtain a smooth uniform solder surface.

Parts are stamped out of the strip. These parts are plated with ¼ micron of silver. The parts are then heat treated at 160° C. for 20 minutes.

EXAMPLE 5

Similar to example 4 except that the solder alloy is 95% tin, 3.5% silver and 1.5% antimony. The stamped parts are electroplated with ¼ micron of gold and heat treated at 160° C. for 5 minutes.

As can be seen, many modifications can be made to the process without departing from the intent of this invention.

We claim:
1. A method of making an integral cover for electronic packages, comprising:
   a) providing a thermal expansion controlled substrate;
   b) depositing a first corrosion resistant and solderable material layer upon at least one surface of the substrate;
   c) applying a layer of solder material upon one side of the first corrosion resistant layer to form a composite substrate;
   d) stamping parts from the composite substrate;
   e) plating the edges and at least the solder layer of the stamped parts with a second corrosion resistant and solderable material; and
   f) preferentially diffusing the plating into the layer of solder by applying heat to the plated parts, thereby allowing the solder material side to be visually identifiable from the other side of the cover.

2. The method to claim 1 wherein the solder is applied by cladding.

3. The method to claim 1 wherein the solder is applied by continuously melting onto the substrate.

4. The method to claim 3 wherein the melted solder is skived.

5. The method to claim 1 further comprising the step of depositing a third corrosion resistant and solderable material over at least one surface of the first corrosion resistant material.

6. The method of claim 5 wherein the third material is gold.

7. The method of claim 5 wherein the third material is silver.

8. The method of claim 1 wherein the solder side is visible due to the diffusion of the third layer into the solder layer.

9. The method of claim 1 wherein the depositing the first layer is continuous.

10. The method of claim 5 wherein the depositing the third layer is continuous.

11. The method of claim 1 wherein the substrate is a strip.

12. The method of claim 1 wherein the substrate is a sheet.

13. The method of claim 1 further comprising stamping a burr onto the solder layer to prevent cracking of the solder material.

14. The method of claim 1 wherein the second material is gold.

15. The method of claim 1 wherein the second material is silver.

16. A method to make a cover for an electronic package comprising:
   a) providing a thermal expansion controlled substrate;
   b) applying a first corrosion resistant and solderable material over at least one side of the substrate;
   c) depositing a second corrosion resistant and solderable material over the first material;
   d) applying solder over one side of the second material to form a composite substrate;
   e) stamping parts from the composite substrate;
   f) plating the parts with a third corrosion resistant and solderable material over at least the edges of the cover and the solder material; and
   g) thermally diffusing the third material into the solder material to allow the recognition of the solder side.

17. The method to claim 16 wherein the solder is applied by cladding.

18. The method to claim 16 wherein the solder is applied by continuously melting onto the substrate.

19. The method to claim 18 wherein the melted solder is skived.

20. The method of claim 16 wherein the second material is gold.

21. The method of claim 16 wherein the second material is silver.

22. The method of claim 16 wherein the solder side is visible due to the diffusion of the third layer into the solder layer.

23. The method of claim 16 wherein the depositing the first layer is continuous.

24. The method of claim 16 wherein the depositing the second layer is continuous.

25. The method of claim 16 wherein the substrate is a strip.

26. The method of claim 16 wherein the substrate is a sheet.

27. The method of claim 16 further comprising stamping a burr onto the solder layer to prevent cracking of the solder material.

28. The method of claim 16 wherein the third material is gold.

29. The method of claim 16 wherein the third material is silver.

30. The method of claim 16 wherein the first material is nickel.

* * * * *